United States Patent [19]

Nakanishi et al.

[11] Patent Number: 4,894,510
[45] Date of Patent: Jan. 16, 1990

[54] APPARATUS FOR UNIFORMLY DISTRIBUTING PLASMA OVER A SUBSTRATE

[75] Inventors: Koichiro Nakanishi; Hiroki Ootera; Minoru Hanazaki; Toshihiko Minami, all of Amagasaki, Japan

[73] Assignee: Mitsubishi Denki Kabushiki Kaisha, Japan

[21] Appl. No.: 92,590

[22] Filed: Sep. 3, 1987

[30] Foreign Application Priority Data

Sep. 5, 1986 [JP] Japan .................. 61-209836
Sep. 10, 1986 [JP] Japan .................. 61-214828
Mar. 2, 1987 [JP] Japan .................. 62-47307

[51] Int. Cl.$^4$ ............................................ B23K 9/00
[52] U.S. Cl. ........................ 219/121.43; 219/121.42; 156/345; 204/192.1
[58] Field of Search ............ 219/121 PD, 121 PF, 219/121 PG, 121 PE; 315/111.81, 111.21, 111.51, 111.41; 156/345, 643, 646; 204/192.12, 192.32, 298, 192.1

[56] References Cited

U.S. PATENT DOCUMENTS

| | | | |
|---|---|---|---|
| 4,430,138 | 2/1984 | Suzuki et al. | 156/345 |
| 4,600,492 | 7/1986 | Ooshio et al. | 156/345 |
| 4,624,767 | 11/1986 | Obinata | 156/345 |
| 4,631,106 | 12/1986 | Nakazato et al. | 156/643 |
| 4,714,536 | 12/1987 | Freeman et al. | 156/345 |

FOREIGN PATENT DOCUMENTS 56-152969 11/1981 Japan.
0150219 7/1986 Japan .................. 156/345

Primary Examiner—M. H. Paschall
Attorney, Agent, or Firm—Leydig, Voit & Mayer

[57] ABSTRACT

In a plasma processor having a plasma generation portion which generates a plasma through electron cyclotron resonance, and a plasma reaction portion which receives therein a substrate to be processed with the plasma; the improvement comprising the fact that the plasma generation portion includes a plasma generating glass tube which can supply a plasma generating gas, an r.f. waveguide which accommodates the plasma generating glass tube and which establishes a nonuniform r.f. electric field perpendicular to an axial direction of the plasma generating portion, and a coil assembly which is arranged around the r.f. waveguide and which establishes a nonuniform magnetostatic field in the axial direction, at least a part of the magnetic field of the coil assembly being subjected to a rotational motion or a rectilinear motion.

22 Claims, 10 Drawing Sheets

FIG. 12
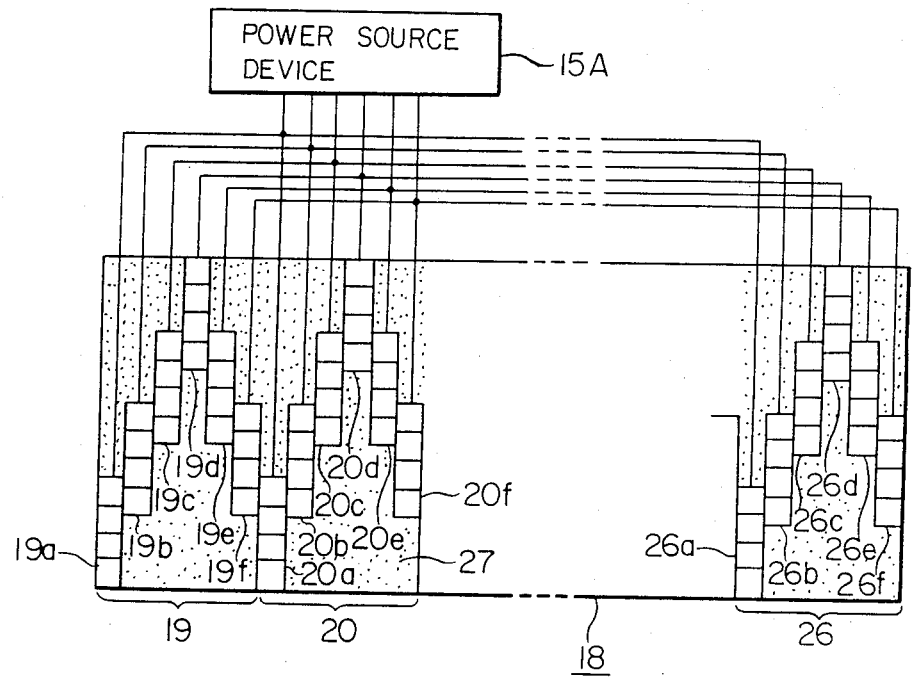
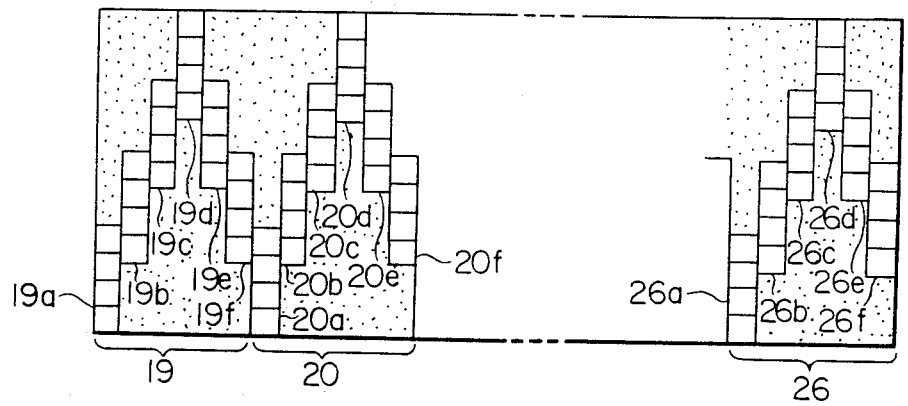

APPARATUS FOR UNIFORMLY DISTRIBUTING PLASMA OVER A SUBSTRATE

BACKGROUND OF THE INVENTION

This invention relates to plasma processor which is a semiconductor fabrication apparatus, and more particularly to a plasma processor which generates plasma by the use of electron cyclotron resonance and can effect a uniform plasma processor over large area of a substrate.

FIG. 1 is a sectional view, partly in blocks, showing the construction of an example of a prior-art plasma processor disclosed in Japanese Pat. application Laid-open No. 79621/1982. The prior-art plasma processor comprises a plasma generation portion 1. This plasma generation portion 1 has a plasma generating vessel, for example, glass tube 2, a ratio-frequency waveguide 3 which accommodates the plasma generating glass tube 2 and which generates a nonuniform r.f. electric field perpendicular to an axial direction (assumed to be the z-direction), and a solenoid coil 5 which is arranged around the r.f. waveguide 3 and which is connected to a D.C. power source 4 so as to generate a nonuniform magnetostatic field in the axial direction. Radio-frequency power is fed to the r.f. waveguide 3 through a magnetron 7 which is mounted on the upper part of the r.f. waveguide 3 and which is connected to a driving power source 6. In addition, a gas is fed to the plasma generating glass tube 2 through a gas supply pipe 8.

The prior-art plasma processor further comprises a plasma reaction portion 9. In this plasma reaction portion 9, there is disposed a stage 10 on which a substrate 11 to be processed with a plasma is placed. An exhaust pipe 12 for exhausting the used gas is connected to the lower part of the plasma reaction portion 9.

The prior-art plasma processor is constructed as stated above, and it forms the plasma on the basis of electron cyclotron resonance. Therefore, this electron cyclotron resonance will be explained below:

Here, B(z) will denote the intensity of the nonuniform magnetostatic field in the axial direction. The r.f. electric power fed into the r.f. waveguide 3 by the magnetron 7 established a nonuniform r.f. electric field $E_{rf}(z)$ within the plasma generation portion 1 which is so shaped as to resonate in accordance with the frequency of the r.f. power. The magnetostatic field in the z-direction, which causes the electron cyclotron resonance with the r.f. electric field $E_{rf}(z)$ within the plasma generation portion 1, lies in a range within the plasma generation portion 1 as shown in FIG. 2. That is, a curve from point A to point B is obtained by connecting the points of magnetic field intensities at which the magnetostatic field intensity $B_z(z)$ in the z-direction cause the resonance with the r.f. electric field $E_{rf}(z)$.

An electron performs a well-known cyclotron motion in the magnetostatic field B, and the angular frequency $\omega_c$ of the cyclotron motion is expressed by $\omega_c = eB/m$ (where $\underline{e}$ denotes the absolute value of electronic charge, and $\underline{m}$ denotes the mass of the electron). Letting $\omega$ denote the angular frequency of the r.f. electric field $E_{rf}(z)$ in the plasma generation portion 1, when the cyclotron resonance condition of $\omega = \omega_c$ holds, the energy of the r.f. power is continuously supplied to the electron, and the energy of the electron increases.

Under such cyclotron resonance conditions, a gas of proper gaseous pressure is introduced into the gas supply pipe 8. Then, the electrons generated in a preliminary discharge state are continuously supplied with energy from the r.f. power, to fall into a high energy state, and the plasma is developed through the process of collisions. The r.f. power is further poured into the plasma thus developed, under the resonance conditions.

Accordingly, assuming by way of example, that the gas introduced through the gas supply pipe 8 is $SiH_4$, the r.f. power is properly adjusted in addition to the pressure of the gas, whereby the types, concentrations and/or energy levels of respective ions such as $Si^+$, $SiH_2^+$ and $SiH_3^+$ can be controlled, and simultaneously, the types, concentrations or/and energy levels of radicals such as $Si^*$ and $SiH_x^*$ can be controlled.

Meanwhile, an axial force $F_z$ given by the following equation acts on the electron in the presence of both the nonuniform magnetostatic field B(z) and the nonuniform electric Field $E_{rf}(z)$, so that the electron is accelerated in the axial direction.

$$F_z = -\mu \frac{dB}{dz} + \frac{\omega_0}{B_0} \cdot \frac{\frac{dB}{dz}}{\left(1 + \frac{m}{M}\right)}$$

where $\mu$ denotes a magnetic moment, B a magnetic flux density, z a distance in the axial direction, $\omega_0$ the energy of the circular motion of the electron, $B_0$ a magnetic flux density in the plasma generation portion 1, $\underline{m}$ the mass of the electron, and M the mass of the ion.

Accordingly, the electrons in the plasma generated by the plasma generation portion 1 in FIG. 1 are axially accelerated toward the plasma reaction portion 9. In consequence, an electrostatic field $E_0(z)$ which accelerates the ions is established in the axial direction within the plasma. This electrostatic field $E_0(z)$ accelerates the plasma as a whole in the axial direction, so that a plasma current 13 extending in the axial direction appears in the plasma reaction portion 9. Since magnetic lines of forces created by the solenoid coil 5 come to have components of an r-direction in the plasma reaction portion 9, the plasma current 13 spreads along the magnetic lines of forces.

Such a plasma processor can be applied to various surface processes including plasma etching, plasma CVD and plasma oxidation, and can effectively perform these processes.

With the prior-art plasma processor utilizing electron cyclotron resonance, the z-directional component $B_z(z)$ of the magnetostatic field causing the resonance with the r.f. electric field $E_{rf}(z)$ does not cover the entire region of the plasma generation portion in the radial direction (r-direction) thereof as seen from FIG. 2. This leads to the problem that, in general, uniformity in the plasma process is difficult to attain. By way of example, when a film is formed by the plasma CVD, the distribution of the thickness of the film becomes nonuniform as illustrated in FIG. 3.

SUMMARY OF THE INVENTION

This invention has been made in order to solve the problem as stated above, and has for its object to provide a plasma processor which can uniformly process a substrate of large diameter with a plasma.

The plasma processor according to this invention comprises a plasma generation portion for generating a plasma, including a plasma generating glass tube which can supply a plasma generating gas, a radio-frequency waveguide which accommodates said plasma generating glass tube and which generates a nonuniform r.f.

electric field in an axial direction of said processor, and coil means arranged around said r.f. waveguide for generating a nonuniform magnetostatic field in the axial direction, and a plasma reaction portion for processing a substrate with the plasma, including means connected with at least a part of said coil means for subjecting a magnetic field produced by at least said part of said coil means to a motion.

In this invention, the magnetic field produced by at least the part of the coil means is subjected to the rotational motion or the rectilinear motion, so that the plasma can be drawn out to a large area. Thus, a substrate of large diameter can be uniformly processed with the plasma.

BRIEF DESCRIPTION OF THE DRAWINGS

FIG. 12 is a sectional view showing the configuration of a magnet coil which is used in the embodiment in FIG. 11;

PREFERRED EMBODIMENTS OF THE INVENTION

Now, embodiments of this invention will be described in detail with reference to the accompanying drawings.

Figure 4:
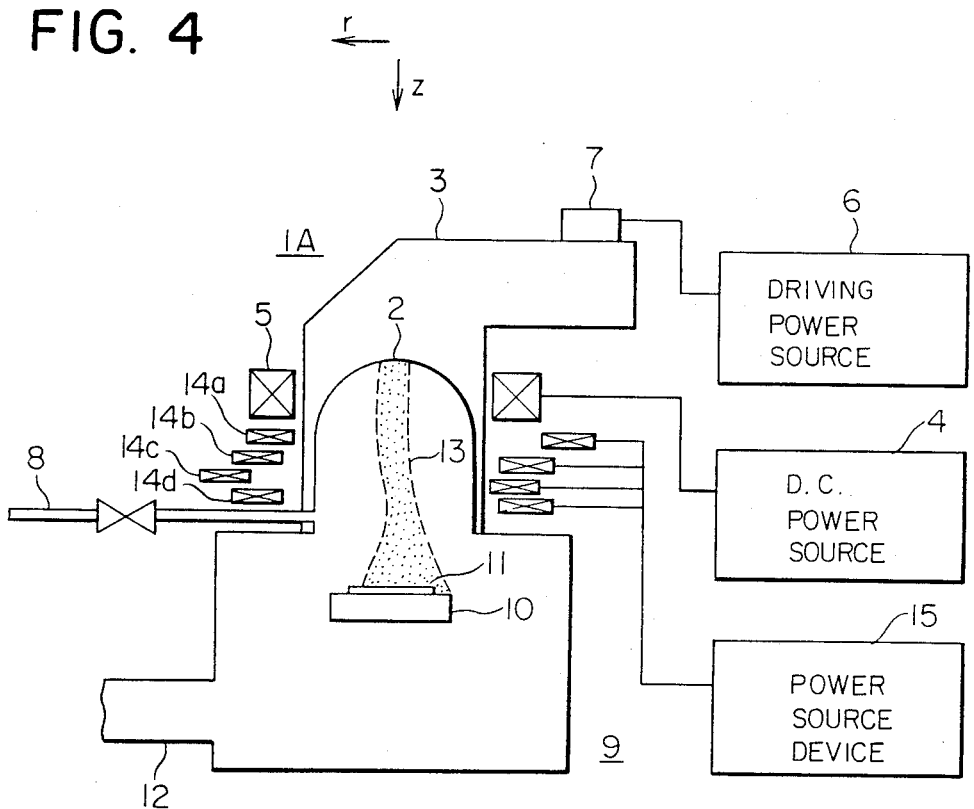
FIG. 4 is a sectional view, partly in blocks, showing the construction embodiment of this invention.

FIG. 4 is a sectional view, partly in blocks, showing an embodiment of a plasma processor according to this invention. In this embodiment, a plasma generation portion 1A includes the plasma generating glass tube 2, the r.f. waveguide 3 and the solenoid coil 5 (called "first solenoid coil" in FIG. 4) explained in conjunction with FIG. 1, and further, a plurality of, for example, four second solenoid coils 14a–14d which are arranged around the r.f. waveguide 3 and the side of the first solenoid coil 5 close to the substrate 11. Moreover, these second solenoid coils 14a–14d are respectively arranged so that the center axes thereof may not be coincident with one another and that they may not be coincident with the center axis of the first solenoid coil 5, and in turn, with the plasma generation portion 1A. In addition, the second solenoid coils 14a–14d are connected to a power source device 15 which causes currents of different phases to flow through these coils in sequence. As in the prior-art processor, r.f. electric power to the r.f. waveguide 3 is fed through the magnetron 7 which is connected to the driving power source 6, and a gas is supplied into the plasma generating glass tube 2 through the gas supply pipe 8.

Figure 1:
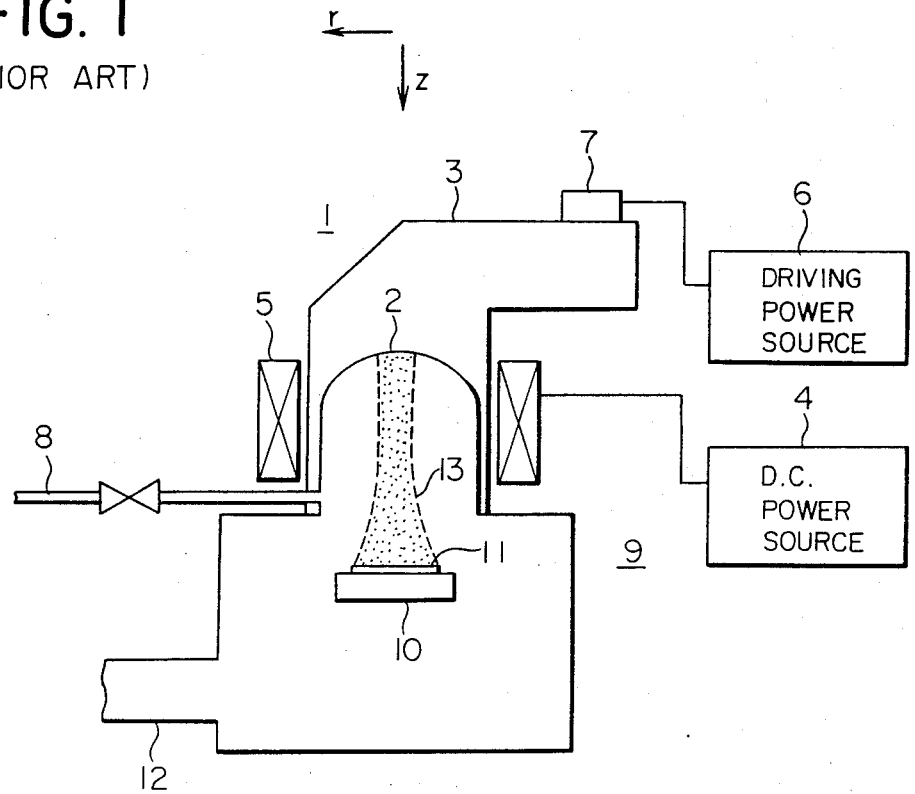
FIG. 1 is a sectional view, partly in blocks, showing the construction of a plasma processor in the prior art.
Figure 2:
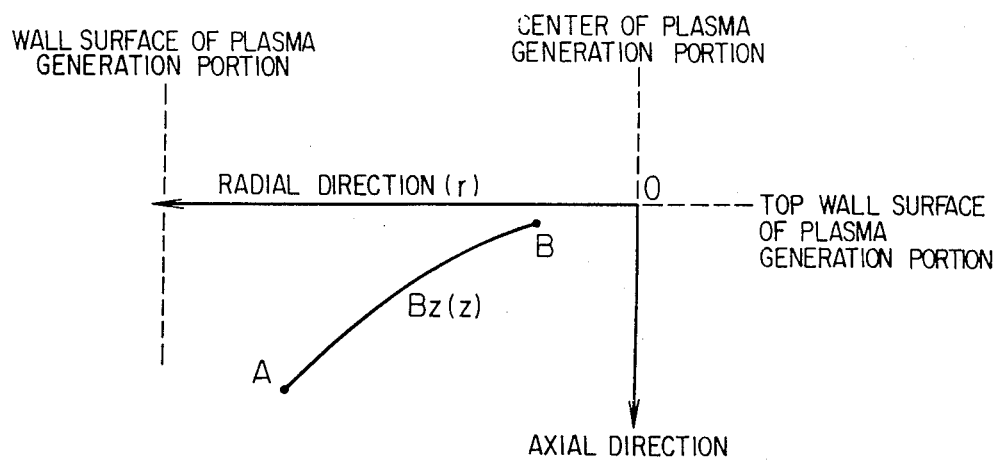
FIG. 2 is a diagram showing the distribution of a magnetostatic field intensity $B_z(z)$ in the direction of a z-axis, which causes electron cyclotron resonance in the prior-art plasma processor.
Figure 3:
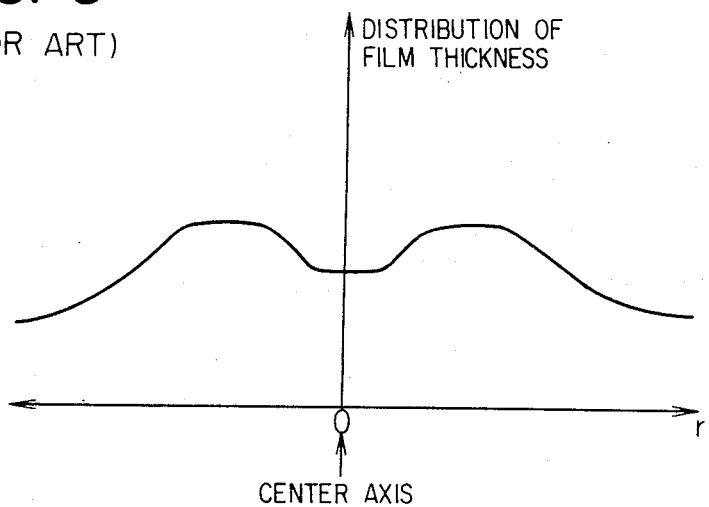
FIG. 3 is a diagram showing the distribution of the thickness of a thin film which is formed by the prior-art plasma processor.

The plasma reaction portion 9 is structurally identical with that explained in conjunction with FIG. 1.

In the plasma processor of this invention, a plasma is also formed by electron cyclotron resonance. The electron cyclotron resonance in this invention, however, is induced by the r.f. electric field $E_{rf}(z)$ and the composite magnetic field $B_z(z)$ of the first solenoid coil 5 and the plurality of second solenoid coils 14a–14d.

If the composite magnetic field $B_z$ is a nonuniform magnetic field, the axial force $F_z$ which acts on electrons is expressed by the following equation as in the case of the prior-art processor:

Accordingly, the electrons in the plasma generated by the plasma generation portion 1A in FIG. 4 are axially accelerated toward the plasma reaction portion 9. In consequence, an electrostatic field $E_0(z)$ which accelerates ions is formed in the axial direction within the plasma. This electrostatic field $E_0(z)$ accelerates the plasma as a whole in the axial direction, so that a plasma current 13 extending in the axial direction appears in the plasma reaction portion 9.

Figure 5:
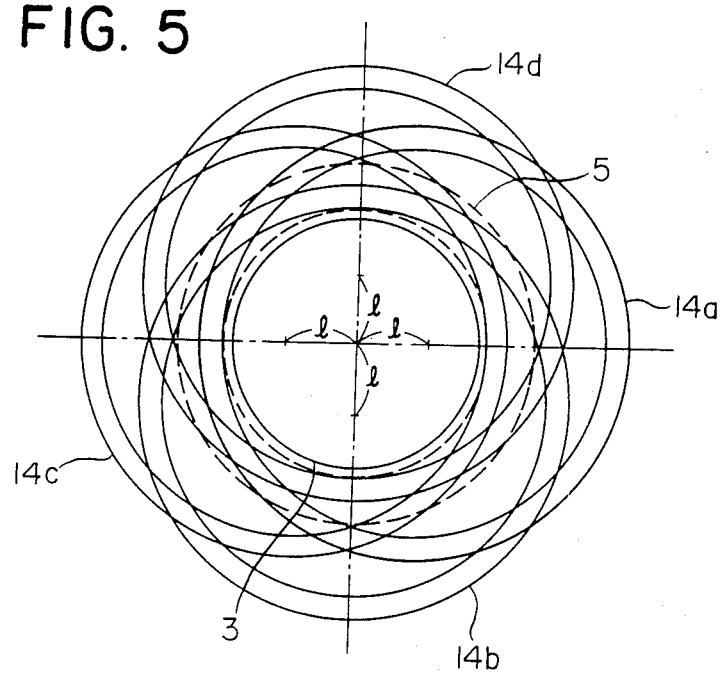
FIG. 5 is a plan view showing the arrangement of a plurality of second solenoid coils shown in FIG. 4.

FIG. 5 is a plan view showing the arrangement of the plurality of second solenoid coils shown in FIG. 4. The four second solenoid coils 14a, 14b, 14c and 14d are respectively arranged so that the center axes thereof may differ by 90° between adjacent axes and so that they are spaced from the center axis of the first solenoid coil 5 by a distance -- --.

Figure 6:
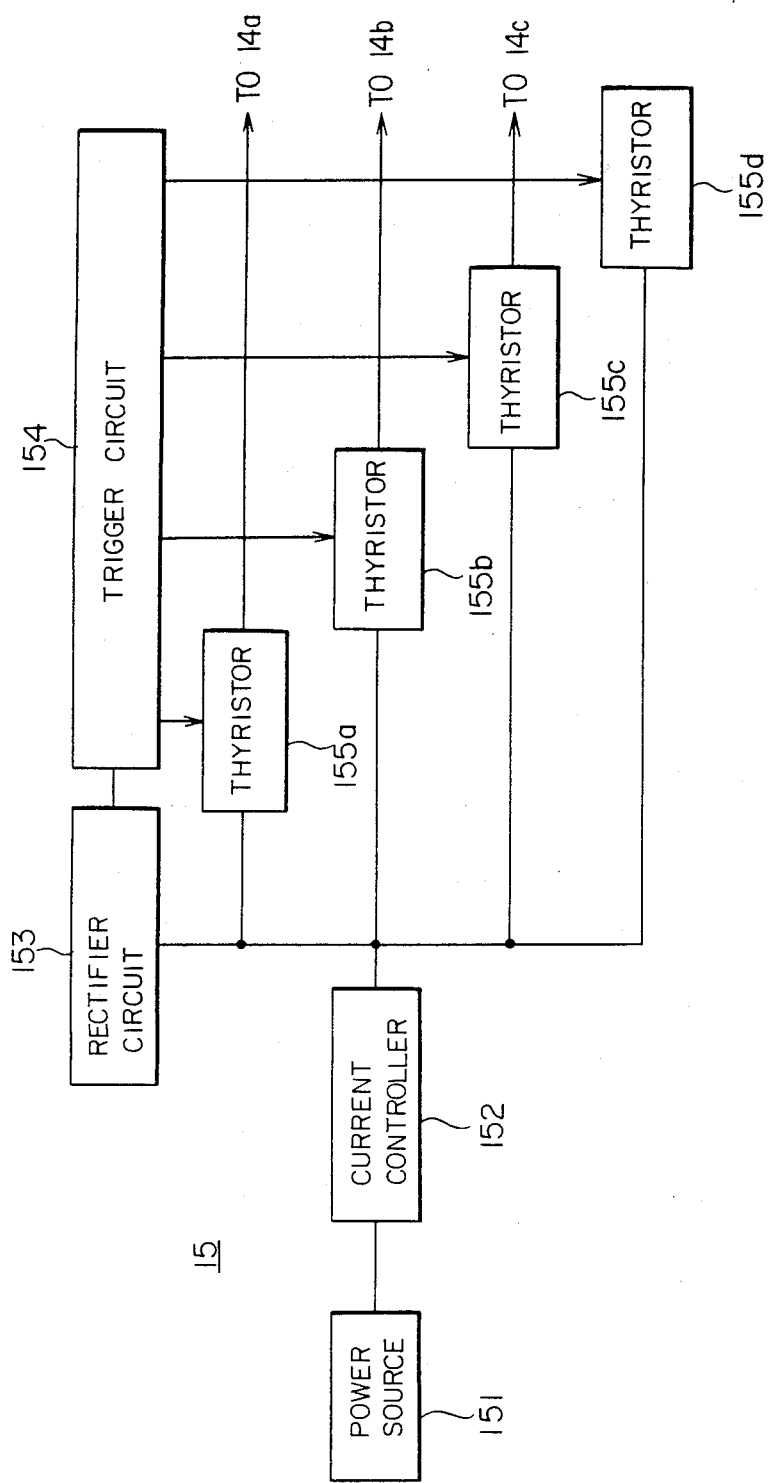
FIG. 6 is a detailed block diagram of a power source device shown in FIG. 4.

FIG. 6 is a detailed block diagram of the power source device 15 shown in FIG. 4. By way of example, this power source device 15 is constructed of a power source 151 of 200 V in three phases, a current controller 152 which controls the output current of the power source 151, a rectifier circuit 153 which rectifies the controlled output current, a trigger circuit 154 which generates firing signals on the basis of the output of the rectifier circuit 153, and thyristors 155a, 155b, 155c and 155d which are individually connected between the current controller 152 and the corresponding second solenoid coils 14a, 14b, 14c and 14d and which are sequentially fired by the firing signals from the trigger circuit 154.

Figure 7:
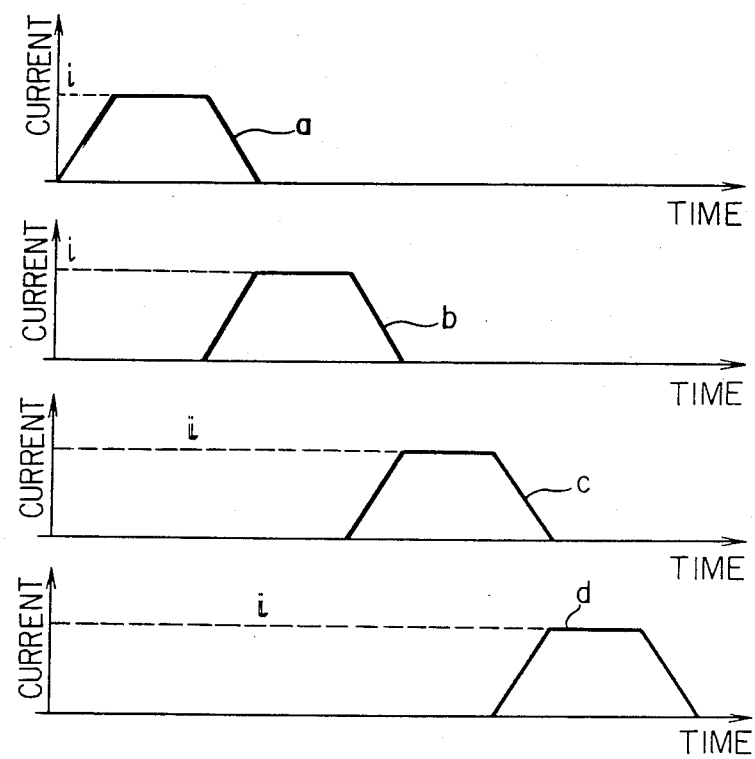
FIG. 7 is a waveform diagram showing currents which are caused to flow through the plurality of second solenoid coils by the power source device.

FIG. 7 is a waveform diagram showing the currents which are caused to flow through the second solenoid coils 14a–14d by the power source device 15. When the power source device 15 causes the respective currents a, b, c and d of different phases to flow through the four second solenoid coils 14a, 14b, 14c and 14d in sequence, magnetic fields induced by the second solenoid coils 14a-14d rotate. When the currents of the waveforms a-d in FIG. 7 are repeatedly caused to flow through the solenoid coils 14a-14d the magnetic fields continue to rotate. The intensity of the rotating magnetic field can be controlled by changing the magnitude of the currents i which are caused to flow through the second solenoid coils 14a-14d, and the radius of rotation of the rotating field can be changed in accordance with the distance l.

The plasma generated in the plasma generation portion 1A is drawn out therefrom into the plasma reaction portion 9 by the electrostatic field $E_0(z)$ mentioned before. On this occasion, in the plasma reaction portion 9, the plasma current 13 is affected by the magnetic fields established by the second solenoid coils 14a-14d, so that the axis of the plasma current 13 deviates from the center axis of the first solenoid coil 5 as illustrated in FIG. 4. Since the magnetic fields established by the second solenoid coils 14a-14d rotate, the plasma current 13 rotates about the z-axis with the same diameter and at the same speed as those of the rotation of the magnetic fields. This operation permits the plasma current 13 to process the substrate 11 over a larger extent, and also allows the realization of a uniform plasma process.

Thus, assuming by way of example, that the gas which is introduced into the gas supply pipe 8 is $SiH_4$, ions such as $Si^+$, $SiH^+$, $SiH_2^+$ $SiH_3^+$ and radicals such as $Si^*$ and $SiH_x^*$ are produced in the plasma generation portion 1A by electron cyclotron resonance, and the produced plasma is accelerated in the axial direction by the electrostatic field $E_0(z)$ stated above. Further, the plasma current 13 is rotated by the rotating magnetic field. In the plasma reaction portion 9, therefore, an amorphous silicon film having a uniform thickness distribution is formed on a large diameter substrate 11.

The embodiment shown in FIG. 4 can be applied to various surface processes including plasma etching plasma CVD and plasma oxidation, and can perform a uniform process in a large area.

Although in the foregoing embodiment, the current i of the waveforms a-b shown in FIG. 7 are caused to flow through the four second solenoid coils 14a-14d, in order to develop the rotating magnetic field, there need only be a plurality of second solenoid coils (however, in the case of two second solenoid coils, the axial magnetic field executes a rectilinear motion, and in the case of three or more, it executes a rotating motion).

Regarding current waveforms, even when current waveforms besides the trapezoidal current waveforms illustrated in FIG. 7, such as alternating half waves, triangular waves or pulse waves are sequentially caused to flow through the plurality of second solenoid coils, the same effect as that of the embodiment is achieved.

Figure 4A:
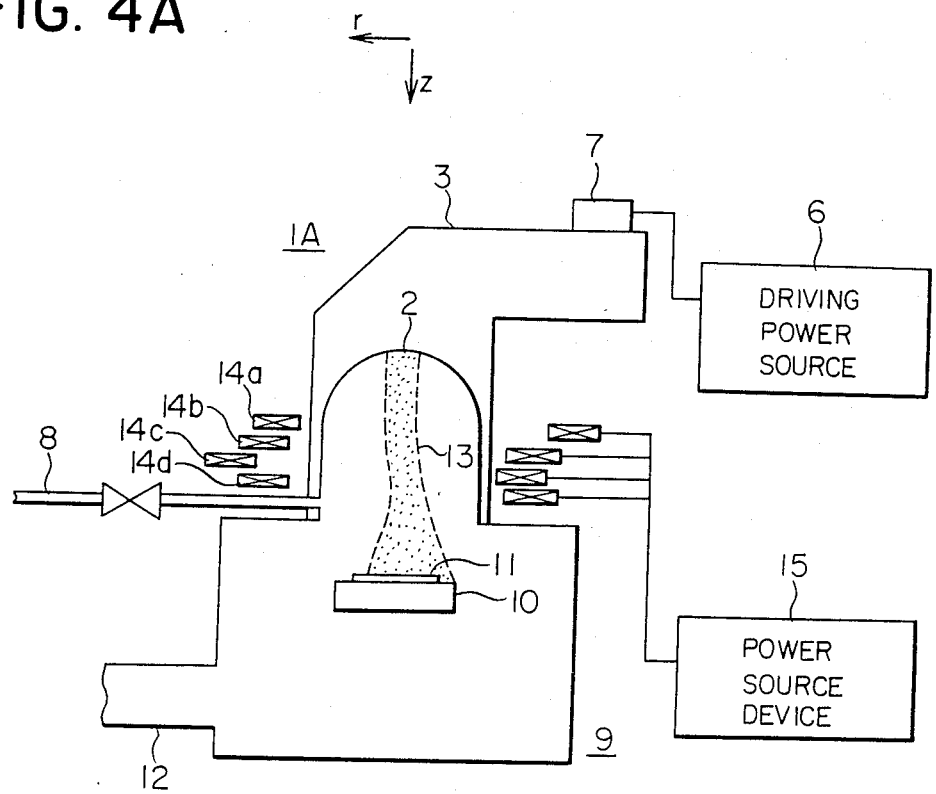
FIG. 4A is a sectional view, partly in blocks, showing construction of a modification of the embodiment in FIG. 4.

Further, in the foregoing embodiment, the plurality of second solenoid coils 14a-14d are disposed on the side of the first solenoid coil 5 near the substrate 11. Thus, a large current is caused to flow through the first solenoid coil 5, and small currents are caused to flow through the second solenoid coils 14a-14d, thereby facilitating the control of the plasma current 13. As shown by a modification in FIG. 4A, however, the plasma may well be produced an controlled by only the plurality of second solenoid coils 14a-14d without providing the first solenoid coil 5.

Figure 8:
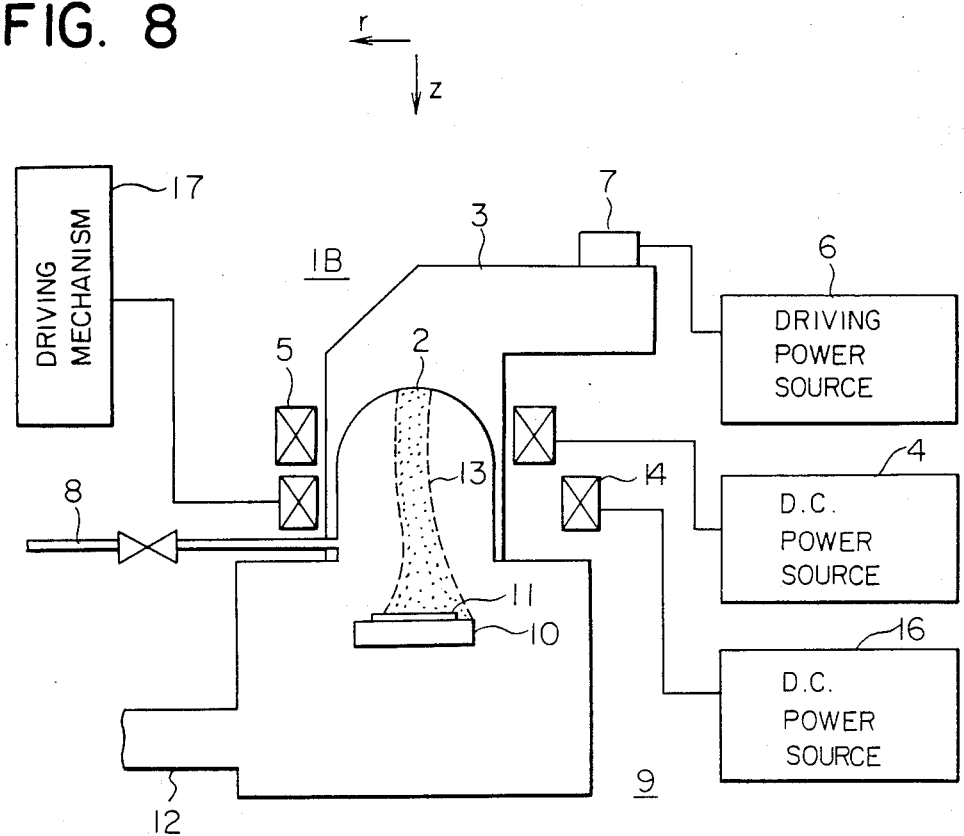
FIG. 8 is a sectional view, partly in blocks, showing the construction of another embodiment of this invention.

FIG. 8 is a sectional view, partly in blocks, showing the construction of another embodiment of this invention. The plasma generation portion 1B in this embodiment includes a single second solenoid coil 14 which replaces the plurality of second solenoid coils 14a-14d shown in FIG. 4. The second solenoid coil 14 is arranged so that the center axis thereof is parallel to the center axis of the first solenoid coil 5. In addition, it is connected to another D.C. power source 16. The embodiment shown in FIG. 8 further comprises a driving mechanism 17. This driving mechanism 17 is mechanically connected to the second solenoid coil 14, and it moves the second solenoid coil 14 on a plane perpendicular to the center axis of the first solenoid coil 5, and in turn, to that of the plasma generation portion 1B.

Also in the embodiment of FIG. 8, a plasma is formed by electron cyclotron resonance. The electron cyclotron resonance in this embodiment, however, is induced by the r.f. electric field $E_{rf}(z)$ of the first solenoid coil 5 and the second solenoid coil 14.

If the composite magnetic field $B_z$ is a nonuniform magnetic field, the axial force $F_z$ which acts on an electron is expressed by the following equation as in the case of the prior-art processor:

$$F_z = -\mu \frac{dB}{dz} + \frac{\omega_0}{B_0} \cdot \frac{\frac{dB}{dz}}{\left(1 + \frac{m}{M}\right)}$$

Accordingly, the electrons in the plasma generated by the plasma generation portion 1B in FIG. 8 are axially accelerated toward the plasma reaction portion 9. In consequence, the electrostatic field $E_0(z)$ which accelerates ions is formed in the axial direction within the plasma. This electrostatic field $E_0(z)$ accelerates the plasma as a whole in the axial direction, so that a plasma current 13 extending in the axial direction appears in the plasma reaction portion 9.

Figure 9:
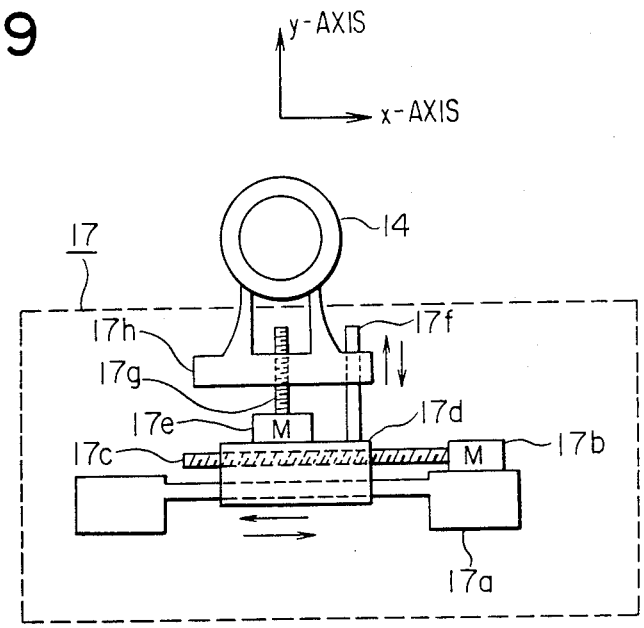
FIG. 9 is view showing the construction of a driver shown by a in FIG. 8.

FIG. 9 is a plan view showing the setup of the driving mechanism shown by block 17 in FIG. 8. The driving mechanism 17 comprises a pedestal 17a, an x-axis driving motor 17b fixed to the pedestal 17a, a threaded shaft 17c fixed to the x-axis driving motor 17b, a carriage 17d which is held in threadable engagement with the threaded shaft 17c and is guided by the pedestal 17a, a y-axis driving motor 17e and a guide rod 17f which are fixed to the carriage 17d, a threaded shaft 17g fixed to the y-axis driving motor 17e, and a carriage 17h which is held in threadable engagement with the threaded shaft 17g and is guided by the guide rod 17f, this carriage 17h being fixed to the second solenoid coil 14.

As seen from FIG. 9, the second solenoid coil 14 is moved in an x-axis direction by the x-axis driving motor 17b and is also moved in the y-axis direction by the y-axis driving motor 17e. Now, if P(x, y) denotes the coordinates of the center of the second solenoid coil 14 with respect to the center of the first solenoid coil 5 for generating the plasma as the origin, when the motors 17b and 17e are simultaneously controlled to move the second solenoid coil 14 under the conditions of $X = R \cos 2\pi f t$ and $y = R \sin 2\pi f t$ (R: radius of rotation, f: rotating frequency, t: motor driving period of time) for example, the center axis of the second solenoid coil 14 is rotated with the radius of rotation R and at the rotating frequency f about the center axis of the first solenoid coil 5, and consequently, a magnetic field induced by the second solenoid coil 14 is rotated. The radius of rotation of the magnetic field can be changed in accordance with the value R, and the speed of rotation can be changed in accordance with the value f.

The plasma generated in the plasma generation portion 1B is drawn out therefrom into the plasma reaction portion 9 by the electrostatic field $E_0(z)$ stated before. On this occasion, in the plasma reaction portion 9, the plasma current 13 is affected by the magnetic field established by the second solenoid coil 14 and is rotated about the z-axis with the same diameter and at the same speed as those of the rotation of the magnetic field. This operation permits the plasma current 13 to process the substrate 11 over a larger area, and also realizes a uniform plasma process.

In this way, as in the embodiment of FIG. 4, an amorphous silicon film having a uniform thickness distribution is formed on the large diameter substrate 11 in the plasma reaction portion 9.

In the embodiment elucidated in conjunction with FIGS. 8 and 9, the second solenoid coil 14 is subjected to the rotational motion by the driving mechanism 17. The motion of the second solenoid coil 14, however, may be any motion as long as it is in the direction perpendicular to the center axis of the first solenoid coil 5.

Figure 10:
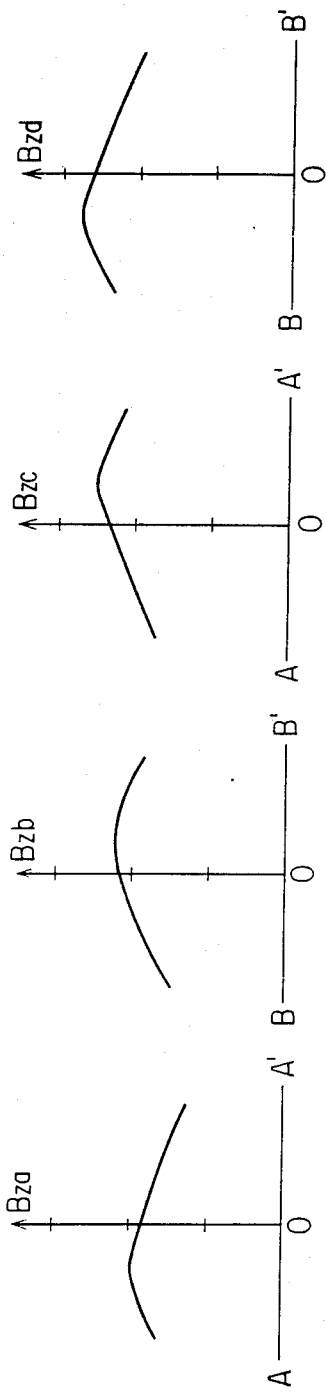
FIG. 10 is a diagram showing the distributions of magnetic flux near a substrate in the plasma processor shown in FIG. 4.

Meanwhile, in the embodiment shown in FIG. 4, the distances of the plurality of second solenoid coils 14a, 14b, 14c and 14d from the substrate 11 differ for the individual coils as depicted in the figure. Accordingly, the magnitudes of magnetic flux densities in the vicinity of the substrate 11 as based on the respective second solenoid coils 14a, 14b, 14c and 14d come to differ as illustrated in FIG. 10. Therefore, when the currents in the different phases are sequentially caused to flow through the plurality of second solenoid coils 14a-14d, a position having a certain specified magnetic field intensity moves on the surface of the substrate while changing the radius of rotation. Consequently, the plasma current 13 in the vicinity of the substrate becomes somewhat nonuniform, and becomes difficult to attain uniformity in the plasma process.

Figure 11:
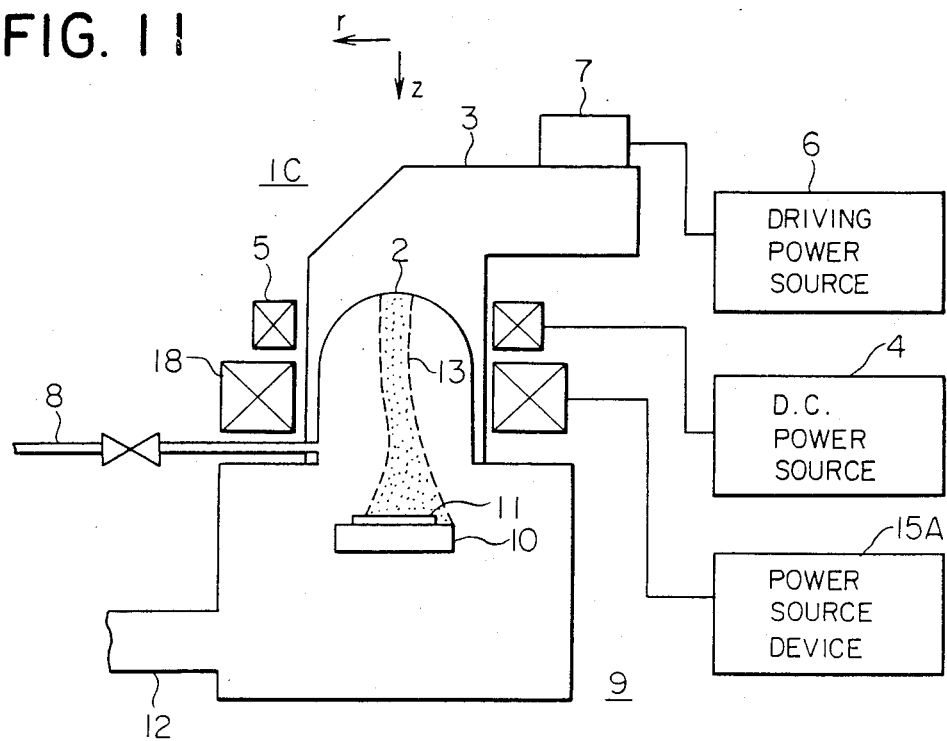
FIG. 11 is a sectional view, partly in blocks, showing the construction of still another embodiment of this invention.

FIG. 11 is a sectional view, partly in blocks, showing the construction of still another embodiment of this invention which is an improvement on the embodiment of FIG. 4. This plasma processor comprises a plasma generation portion 1C, and a plasma reaction portion 9 identical to that shown in FIG. 1, including the stage 10, the substrate 11 and the exhaust pipe 12. The plasma generation portion 1C which besides the plasma generating glass tube 2, the r.f. waveguide 3 and the solenoid coil 5 connected to the D.C. power source 4, which are also identical to those shown in FIG. 1, also includes an electromagnetic coil 18 which is arranged around the r.f. waveguide 3 and on the substrate side of the solenoid coil 5 and which is connected to a power source device 15A similar to the power source device 15 (FIG. 4) for sequentially supplying currents of different phases, so as to establish a magnetic field rotating with a uniform magnitude.

FIG. 12 is a sectional view showing the setup of the electromagnetic coil 18 which is used in the embodiment of FIG. 11. This electromagnetic coil 18 is composed of a plurality of, for example, eight subcoils 19-26 which are identical in configuration and size. Each of the subcoils is made up of a plurality of, for example, six windings $19a$-$19f$, $20a$-$20f$, ...... or $26a$-$26f$ and an insulator 27. The plurality of windings of each subcoil are respectively arranged in a geometrical shape in which the center axes thereof do not coincide with one another. Further, the windings of each subcoil are arranged so that the geometrical positions thereof may coincide with those of the corresponding windings of any other subcoil on a plane perpendicular to the center axis of the solenoid coil 5. The corresponding windings of the subcoils which have coincident geometrical positions are connected together, whereupon they are connected to the power source device 15A.

In the plasma processor of FIG. 11, the solenoid coil 5 connected to the D.C. power source 4 establishes an axially-nonuniform magnetostatic field, the electromagnetic coil 18 connected to the power source device 15A establishes a magnetic field rotating with the uniform magnitude, and r.f. electric power is fed by the magnetron 7 connected to the driving power source 6. Then, the r.f. waveguide 3 introduces an r.f. electric field perpendicular to the axial direction. Further, a gas is supplied into the plasma generating glass tube 2 through the gas supply pipe 8.

The plasma is formed by electron cyclotron resonance as in the foregoing plasma processors. The electron cyclotron resonance in this embodiment, however, is induced by the r.f. electric field $E_{rf}(z)$ of the r.f. waveguide 3 and the composite magnetic field $B_z(z)$ of the solenoid coil 5 and the electromagnetic coil 18.

If the composite magnetic field $B_z$ is a nonuniform magnetic field, the axial force $F_z$ which acts on an electron is expressed by the following equation as in the case of the prior-art processor:

$$F_z = -\mu \frac{dB}{dz} + \frac{\omega_0}{B_0} \cdot \frac{\frac{dB}{dz}}{\left(1 + \frac{m}{M}\right)}$$

where $\mu$ denotes a magnetic moment, B a magnetic flux density, z a distance in the axial direction, $\omega_0$ the energy of the circular motion of the electron, $B_0$ a magnetic flux density in the plasma generation portion 1C, m the mass of the electron, and M the mass of an ion. Accordingly, the electrons in the plasma generated by the plasma generation portion 1C in FIG. 11 are axially accelerated toward the plasma reaction portion 9. In consequence, the electrostatic field $E_0(z)$ which accelerates the ions is formed in the axial direction within the plasma. This electrostatic field $E_0(z)$ accelerates the plasma as a whole in the axial direction, so that a plasma current 13 extending in the axial direction appears in the plasma reaction portion 9.

Figure 13:
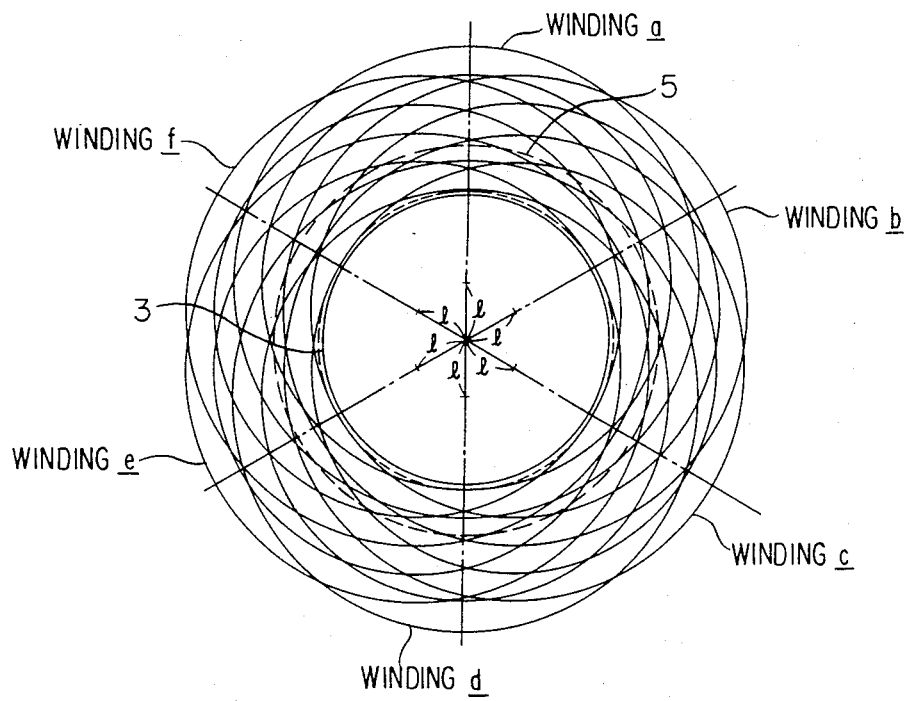
FIG. 13 is a plan view showing the arrangement of the plurality of windings of the magnet coil.

FIG. 13 is a plan view showing the arrangement of the six windings a, b, c, d, e and f in FIG. 12. Here, these symbols denote the following:

<u>a</u>; Generic term for windings $19a$, $20a$, ..... and $26a$
<u>b</u>; Generic term for windings $19b$, $20b$, ..... and $26b$
<u>c</u>; Generic term for windings $19c$, $20c$, ..... and $26c$
<u>d</u>; Generic term for windings $19d$, $20d$, ..... and $26d$
<u>e</u>; Generic term for windings $19e$, $20e$, ..... and $26e$
<u>f</u>; Generic term for windings $19f$, $20f$, ..... and $26f$ The six windings a, b, c, d, e and f are respectively arranged so that the center axes thereof differ by 60° between adjacent ones and so that they are spaced from the center axis of the solenoid coil 5 by a distance 1.

Letting $B_a$, $B_b$, $B_c$, $B_c$, $B_e$ and $B_f$ denote the magnitudes of the magnetic flux densities in the vicinity of the substrate 11 as based on the six windings a, b, c, d, e and f, respectively, the following relation approximately holds true because the average distances between the respective windings and the substrate 11 are substantially equal:

$$B_a=B_b=B_c=B_d=B_e=B_f$$

Figure 14:
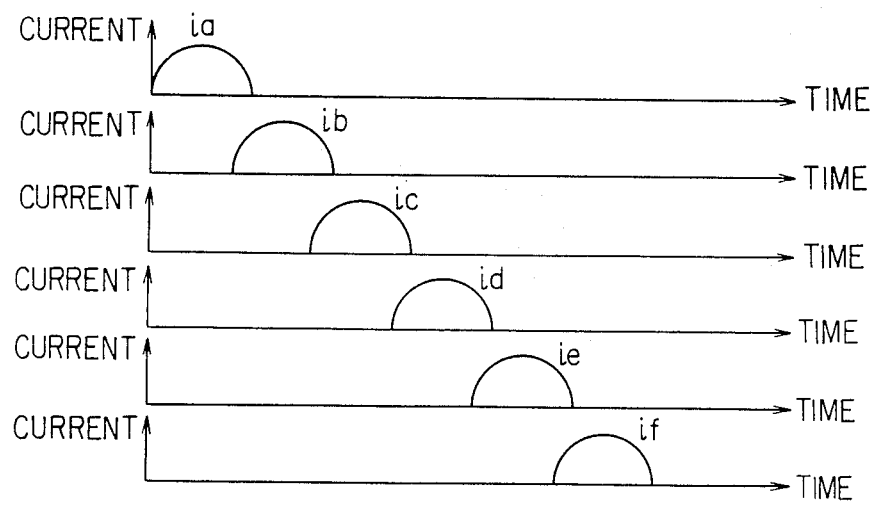
FIG. 14 is a waveform diagram showing currents which are caused to flow through the magnet coil.

When currents in waveforms $i_a$, $i_b$, $i_c$, $i_d$, $i_e$ and $i_f$ illustrated in FIG. 14 are respectively caused to flow through the six windings a, b, c, d, e and f from the power source device 15A, magnetic fields induced by these windings a, b, c, d, e and f rotate with uniform magnitudes. When the currents of the waveforms in FIG. 14 are repeatedly caused to flow through the windings a, b, c, d, e and f, the magnetic fields continue to rotate. The intensity of the rotating magnetic field is controlled by changing the magnitude of the currents which are caused to flow through the windings a, b, c, d, e and f, and the radius of rotation of the rotating field can be changed in accordance with the distance l.

The plasma generated in the plasma generation portion 1C is drawn out therefrom into the plasma reaction portion 9 by the electrostatic field $E_0(z)$ stated before. On this occasion, in the plasma reaction portion 9, the plasma current 13 is affected by the magnetic fields established by the windings a, b, c, d, e and f, so that the axis of the plasma current 13 deviates from the center axis of the solenoid coil 5 as illustrated in FIG. 11. Since, however, the magnetic fields established by the windings a, b, c, d, e and f rotate with uniform magnitudes, the plasma current 13 rotates about the z-axis with the same diameter and at the same speed as those of the rotation of the magnetic fields. This operation permits the plasma current 13 to process the substrate 11 over a larger extent, and also allows the realization of a uniform plasma process.

Although, in the embodiment of FIG. 11, the electromagnetic coil 18 is constructed of the eight subcoils 19-26, the subcoils may be in any plural number. In addition, although the embodiment has been described as to the example in which the currents shown in FIG. 14 are caused to flow through the six windings a, b, c, d, e and f in order to establish the rotating magnetic field, the windings may be in any plural number. In this regard, in case of two windings, the axial magnetic field performs a rectilinear motion, and in case of at least three windings, the magnetic field performs a rotational motion.

Figure 11A:
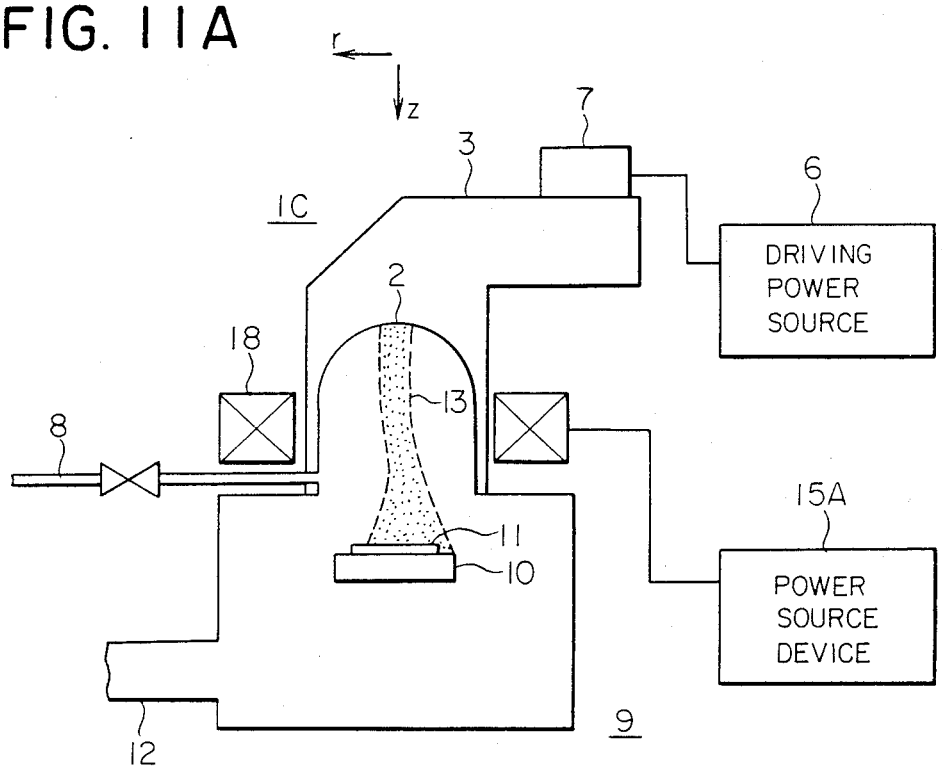
FIG. 11A is a sectional view, partly in blocks, showing the construction of a modification of the embodiment in FIG. 11.

Since the electromagnetic coil 18 is disposed on the substrate side of the solenoid coil 5, a large current is caused to flow through the solenoid coil 5, and small currents are caused to flow through the electromagnetic coil 18, thereby facilitating the control of the plasma current 13. As shown by a modification in FIG. 11A, however, the plasma may well be produced and controlled by only the electromagnetic coil 18 without providing the solenoid coil 5.

What is claimed is:

1. A plasma processor comprising:
   a plasma generation portion which generates a plasma through electron cyclotron resonance; and
   a plasma reaction portion in which a substrate to be processed with the plasma generated by said plasma generation portion is located;
   said plasma generation portion having a center axis running through the substrate and including:
   a plasma generating glass tube which can supply a plasma generating gas,
   a radio frequency (r.f.) waveguide which accommodates said plasma generating glass tube therein and which establishes a nonuniform r.f. electric field perpendicular to an axial direction of said plasma generation portion,
   coil means arranged around said r.f. waveguide for establishing a nonuniform magnetostatic field in the axial direction, the r.f. electric field and the magnetostatic field causing plasma to flow as a plasma current in the axial direction, the plasma current having a plasma current axis, and
   power source means connected to provide current to at least a part of said coil means for subjecting a motion to a magnetic field induced by at least said part of said coil means, the motion of the magnetic field causing a motion of the plasma current including a deviation of the axis of the plasma current from the center axis of the plasma generation portion, thereby distributing plasma over the substrate with improved uniformity.

2. A plasma processor as defined in claim 1 wherein said coil means includes a first solenoid coil connected to a direct current (D.C.) power source for establishing the magnetostatic field due to a large current caused to flow from said D.C. power source, and a plurality of second solenoid coils arranged on a side of said first solenoid coil near the substrate for establishing a composite magnetic field with said first solenoid coil, said second solenoid coils being respectively arranged so that the center axis thereof are offset from each other and are offset from a center axis of said first solenoid coil, and wherein the power source means is a power source device which causes smaller currents of different phases to flow through said plurality of second solenoid coils in sequence to thereby subject the motion to the magnetic field and the plasma current established by said second solenoid coils, the motion including a deviation of the plasma current axis from the center axis of the plasma generation portion according to the currents flowing through the second solenoid coils.

3. A plasma processor as defined in claim 1 wherein said coil means includes a plurality of solenoid coils, said solenoid coils being respectively arranged so that center axes thereof are offset from each other and are offset from a center axis of said plasma generation portion, and wherein the power source means is a power source device which causes currents of different phases to flow through said plurality of second solenoid coils in sequence to thereby subject the motion to the magnetic field and the plasma current established by said solenoid coils, the motion including a deviation of the plasma current axis from the center axis of the plasma generation portion according to the currents flowing through the second solenoid coils.

4. A plasma processor as defined in claim 2 wherein said plurality of second solenoid coils are respectively arranged so that the center axes thereof differ between adjacent axes and so that they are spaced from the center axis of said plasma generation portion by a distance l.

5. A plasma processor as defined in claim 3 wherein said plurality of solenoid coils are respectively arranged so that the center axes thereof differ between adjacent axes and so that they are spaced from the center axis of said plasma generation portion by a distance l.

6. A plasma processor as defined in claim 4 wherein there are at least three of said second solenoid coils, the magnetic field generated by the second solenoid coils and the plasma current perform the rotational motion, a radius of which can be changed depending upon the distance l.

7. A plasma processor as defined in claim 5 wherein there are at least three of said solenoid coils, the magnetic field generated by the solenoid coils and the plasma current perform the rotational motion, a radius of which can be changed depending upon the distance l.

8. A plasma processor as defined in claim 2 wherein when there are two of said second solenoid coils, the magnetic field generated by the second solenoid coils and the plasma current perform the rectilinear motion.

9. A plasma processor as defined in claim 3 wherein when there are two of said solenoid coils, the magnetic field generated by the solenoid coils and the plasma current perform the rectilinear motion.

10. A plasma processor as defined in claim 2 wherein the currents which are caused to flow by said power source device are in a waveform selected from the group consisting of a trapezoidal wave, an alternating half wave, a triangular wave, and a pulse wave.

11. A plasma processor as defined in claim 3 wherein the currents which are caused to flow by said power device are in a waveform selected from the group consisting of a trapezoidal wave, an alternating half wave, a triangular wave, and a pulse wave.

12. A plasma processor as defined in claim 1 wherein said coil means includes a solenoid coil connected to a direct current (D.C.) power source for establishing the magnetostatic field due to a large current caused to flow from said D.C. power source, and an electromagnetic coil arranged on a side of said solenoid coil near the substrate for establishing a composite magnetic field with said solenoid coil, said electromagnetic coil being composed of a plurality of subcoils which are identical in configuration and size, each said subcoil including a plurality of windings which are arranged so that center axes thereof are offset from adjacent axes other and so that they are offset from a center axis of said solenoid coil, the windings of said each subcoil being arranged so that geometrical positions thereof coincide with those of the corresponding windings of the other subcoils on a plane perpendicular to the center axis of said solenoid coil, the corresponding windings of said respective subcoils with the coinciding geometrical positions being connected together, wherein the power source means is a power source device which causes smaller currents of different phases to flow through the windings connected together in sequence to thereby subject the magnetic field of uniform magnitude established by said magnet coil and the plasma current to the motion, the motion including a deviation of the plasma current axis from the center axis of the plasma generating portion according to the currents flowing through the subcoils.

13. A plasma processor as defined in claim 1 wherein said coil means includes an electromagnetic coil, said electromagnetic coil being composed of a plurality of subcoils which are identical in configuration and size, said each subcoil including a plurality of windings which are arranged so that center axes thereof are offset from adjacent axes and so that they are offset from a center axis of said plasma generation portion, the windings of said each subcoil being arranged so that geometrical positions thereof coincide with those of the corresponding windings of the other subcoils on a plane perpendicular to the center axis of said plasma generation portion, and the corresponding windings of said respective subcoils having the coincident geometrical positions are connected together, and wherein the power source means is a power source device which causes smaller currents of different phases to flow through the windings connected together in sequence to thereby subject the magnetic fields of uniform magnitude and the plasma current to the motion, the motion including a deviation of the plasma current axis from the center axis of the plasma generating portion according to the currents flowing through the subcoils.

14. A plasma processor as defined in claim 12 wherein said windings connected together in said subcoils of said electromagnetic coil are respectively arranged so that the center axes thereof differ between the adjacent axes and so that they may be spaced from the center axes of said plasma generation portion by a predetermined distance l.

15. A plasma processor as defined in claim 13 wherein said windings connected together in said subcoils of said electromagnetic coil are respectively arranged so that the center axes thereof differ between the adjacent axes and so that they may be spaced from the center axis of said plasma generation portion by a predetermined distance l.

16. A plasma processor as defined in claim 14 wherein when there are at least three of said windings connected together in said plurality of subcoils of said electromagnetic coil, the magnetic fields established by the subcoils and the plasma current perform the rotational motion, a radius of which can be changed depending upon the distance.

17. A plasma processor as defined in claim 15 wherein when there are at least three of said windings connected together in said plurality of subcoils of said electromagnetic coil, the magnetic fields established by the subcoils and the plasma current perform the rotational motion, a radius of which can be changed depending upon the distance l.

18. A plasma processor as defined in claim 12 wherein when there are two of said windings connected together in said plurality of subcoils of said electromagnetic coil, the magnetic fields established by the subcoils and the plasma current perform the rectilinear motion.

19. A plasma processor as defined in claim 13 wherein when there are two of said windings connected together in said plurality of subcoils of said electromagnetic coil, the magnetic fields established by the subcoils and the plasma current perform the rectilineal motion.

20. A plasma processor as defined in claim 12 wherein the currents which are caused to flow by said power source device are in a waveform selected from the group consisting of a trapezoidal wave, an alternating half wave, a triangular wave, and a pulse wave.

21. A plasma processor as defined in claim 13 wherein the currents which are caused to flow by said power source device are in a waveform selected from the group consisting of a trapezoidal wave, an alternating half wave, a triangular wave, and a pulse wave.

22. A plasma processor comprising:
   a plasma generation portion which generates a plasma through electron cyclotron resonance; and
   a plasma reaction portion in which a substrate to be processed with the plasma generated by said plasma generation portion is located;
   said plasma generation portion having a center axis running through the substrate and including:
   a plasma generating glass tube which can supply a plasma generating gas,
   a radio frequency (r.f.) waveguide which accommodates said plasma generating glass tube therein and which establishes a nonuniform r.f. electric field perpendicular to an axial direction of said plasma generation portion, coil means arranged around said r.f. waveguide for establishing a nonuniform magnetostatic field in the axial direction, the r.f. electric field and the magnetostatic field causing plasma to flow as a plasma current in the axial direction, the plasma current having a plasma current axis, the coil means including a first solenoid coil connected to a direct current (D.C.) power source for establishing the magnetostatic field due to a large current caused to flow from said D.C. power source, and a second solenoid coil arranged on a side of said first solenoid coil near the substrate and connected to another D.C. power source for establishing a composite magnetic field with said first solenoid coil due to a current caused to flow from the other D.C. power source, said second solenoid coil being arranged so that a center axis thereof does not coincide with a center axis of said first solenoid coil, and means connected to at least a part of said coil means for subjecting a motion to a magnetic field induced by at least said part of said coil mans, the motion of the magnetic field causing a motion of the plasma current including a deviation of the axis of the plasma current from the center axis of the plasma generation portion, the means for subjecting a motion including a mechanical driver which includes an x-axis driving motor and a y-axis driving motor for moving said second solenoid coil in an x-axis direction and a y-axis direction on a plane perpendicular to the center axis of said first solenoid coil, respectively, and which subjects the magnetic field established by said second solenoid coil and the plasma current to the motion, the motion including a deviation of the plasma current axis according to the movement of the second solenoid coil in the x-axis and y-axis directions, thereby distributing plasma over the substrate with improved uniformity.

* * * * *

UNITED STATES PATENT AND TRADEMARK OFFICE
CERTIFICATE OF CORRECTION

PATENT NO. : 4,894,510

DATED : January 16, 1990

INVENTOR(S) : Nakanishi et al

It is certified that error appears in the above-identified patent and that said Letters Patent is hereby corrected as shown below:

Col. 11, line 22, after "power" insert --source--;

line 49, change "field" to --fields--.

Col. 12, line 29, after "distance" insert --1--.

Signed and Sealed this

Twenty-sixth Day of February, 1991

Attest:

HARRY F. MANBECK, JR.

*Attesting Officer*        *Commissioner of Patents and Trademarks*